US010014409B1

(12) United States Patent
Wu et al.

(10) Patent No.: US 10,014,409 B1
(45) Date of Patent: Jul. 3, 2018

(54) METHOD AND STRUCTURE TO PROVIDE INTEGRATED LONG CHANNEL VERTICAL FINFET DEVICE (71) Applicant: GLOBALFOUNDRIES INC., Grand Cayman (KY)

(72) Inventors: Xusheng Wu, Ballston Lake, NY (US); David Paul Brunco, Latham, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/393,400

(22) Filed: Dec. 29, 2016

(51) Int. Cl.
*H01L 29/732* (2006.01)
*H01L 21/8234* (2006.01)
*H01L 27/088* (2006.01)
*H01L 29/423* (2006.01)
*H01L 29/78* (2006.01)
*H01L 29/66* (2006.01)
*H01L 29/40* (2006.01)
*H01L 29/08* (2006.01)
*H01L 29/06* (2006.01)

(52) U.S. Cl.
CPC ...... *H01L 29/7827* (2013.01); *H01L 27/0886* (2013.01); *H01L 29/0649* (2013.01); *H01L 29/0847* (2013.01); *H01L 29/401* (2013.01); *H01L 29/66666* (2013.01); *H01L 29/66795* (2013.01)

(58) Field of Classification Search
None
See application file for complete search history.

(56) References Cited

U.S. PATENT DOCUMENTS

| 2007/0252196 A1* | 11/2007 | Kim | H01L 21/823842 257/329 |
| 2008/0179664 A1* | 7/2008 | Rao | B82Y 10/00 257/329 |
| 2010/0148221 A1* | 6/2010 | Yu | B82Y 20/00 257/225 |
| 2010/0181614 A1* | 7/2010 | Nojima | H01L 29/66666 257/329 |
| 2012/0270374 A1* | 10/2012 | Masuoka | H01L 27/0207 438/268 |
| 2013/0056698 A1* | 3/2013 | Satoh | H01L 27/101 257/2 |

* cited by examiner

*Primary Examiner* — Khaja Ahmad
(74) *Attorney, Agent, or Firm* — Scully Scott Murphy and Presser; Frank Digiglio (57) ABSTRACT

A vertical fin field effect transistor includes a semiconductor fin disposed over a well region and a gate conductor layer disposed over a sidewall of the fin, and extending laterally over a top surface of the well region adjacent to the fin. The extension of the gate conductor over the bottom source/drain effectively increases the channel length of the vertical FinFET device independent of the fin height. A bottom source/drain region is laterally adjacent to the well region such that the portion of the well region covered by the laterally extended gate stack is between the bottom source/drain region and the portion of the well region immediately under the fin. A top source/drain region is located above the fin. The device is operated in circuits by use of electrical contacts to the bottom source/drain, the gate conductor, and the top source/drain.

9 Claims, 7 Drawing Sheets

METHOD AND STRUCTURE TO PROVIDE INTEGRATED LONG CHANNEL VERTICAL FINFET DEVICE

BACKGROUND

The present application relates generally to semiconductor devices, and particularly to vertical fin field effect transistors (V-FinFETs) and their methods of fabrication.

Fully-depleted devices such as fin field effect transistors (FinFETs) are candidates to enable scaling of next generation gate lengths to 14 nm and below. Fin field effect transistors (FinFETs) present a three-dimensional architecture where the transistor channel is raised above the surface of a semiconductor substrate, rather than locating the channel at or just below the surface. With a raised channel, the gate can be wrapped around or formed over the sides of the channel, which provides improved electrostatic control of the device.

The manufacture of FinFETs typically leverages a self-aligned process to produce extremely thin fins, e.g., 20 nm wide or less, on the surface of a substrate using selective-etching techniques. A gate structure is then deposited to contact multiple surfaces of each fin to form a multi-gate architecture.

Vertical FETs are devices where the source-drain current flows in a direction normal to the substrate surface. In vertical FinFET devices, the fin defines the transistor channel with the source and drain regions located at opposing (i.e., upper and lower) ends of the fin.

During manufacture of a vertical FET, the channel length is typically defined by etch back of the gate conductor. A challenge associated with a vertical FET architecture is the ability to co-integrate devices having different channel lengths on the same substrate or chip. Moreover, the formation of long channel devices, such as where the channel length exceeds the height of the fin, is problematic. Accordingly, it would be advantageous to provide a robust, vertical FinFET manufacturing process and associated structure that are compatible with existing circuit designs, while providing a variable channel length, i.e., both short and long channel devices, on a common platform.

SUMMARY

In accordance with embodiments of the present application, a method of forming a vertical FinFET device involves forming a gate conductor over the sidewall of a fin and extending the gate conductor laterally over a top surface of a well region adjacent to the fin. The extension of the gate conductor over the well region effectively increases the channel length of the device. In contrast to a conventional vertical FinFET, such a device includes both a vertical and a horizontal component to the gate, which can be defined lithographically. By varying the lateral extent of the gate conductor, vertical FinFET devices having different channel lengths can be produced on the same substrate.

According to various embodiments, a method of making a vertical FinFET device includes forming a fin having a height (H) on a semiconductor substrate, forming a well region in the substrate, where a lower end of the fin is in contact with the well region, and forming a bottom source/drain region in the substrate that is laterally adjacent the well region. A main gate stack including a main gate dielectric and a main gate conductor is formed over one sidewall of the fin, such that the main gate stack extends laterally over the well region and the bottom source/drain region on at least one side of the fin. Then, a portion of the main gate conductor over the bottom source/drain region is etched to define a channel region between the main gate conductor and the fin and between the main gate conductor and the well region.

According to further embodiments, a vertical FinFET includes a fin disposed on a semiconductor substrate and in contact with a well region disposed within the substrate. A main gate stack comprising a main gate dielectric and main gate conductor is disposed over at least one sidewall of the fin and extends laterally over a portion of the well region on at least one side of the fin. A channel region extends between the main gate conductor and the fin and between the main gate conductor and the well region on the at least one side of the fin. The FinFET further includes a bottom source/drain region laterally adjacent to the well region on the at least one side of the fin, wherein the portion of the well region underlying the main gate stack is disposed between the bottom source/drain region and the well region in contact with the lower end of the fin.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Reference will now be made in greater detail to various embodiments of the subject matter of the present application, some embodiments of which are illustrated in the accompanying drawings. The same reference numerals will be used throughout the drawings to refer to the same or similar parts.

Embodiments of the application relate generally to the manufacture of semiconductor devices, and more particularly to the manufacture of vertical fin field effect transistors (V-FinFETs). Exemplary structures include vertical fin field effect transistors having a controlled channel length, and in various embodiments include both a short channel device and long channel device.

As used herein, the terms "short channel," "short channel vertical fin field effect device," "short channel structure" and the like refer to devices or structures where the channel length is less than the height of the fin. Example short channel structures have a channel length of 15 to 100 nm, e.g., 15, 20, 30, 40, 50, 60, 70, 80, 90 or 100 nm, including ranges between any of the foregoing values. As used herein, the terms "long channel," "long channel vertical fin field effect device," "long channel structure" and the like refer to devices or structures where the channel length is greater than or equal to the height of the fin. Example long channel structures have a channel length of greater than 100 nm, e.g., 100, 120, 150, 180 or 200 nm, including ranges between any of the foregoing values.

Figure 1:
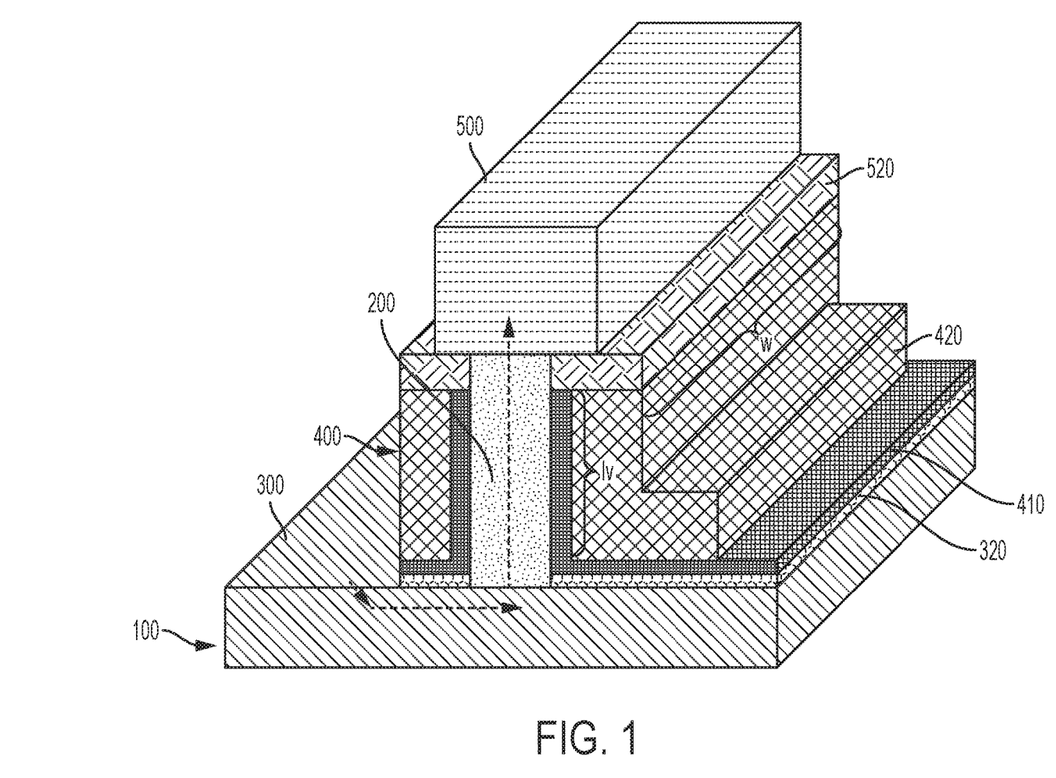
FIG. 1 is a simplified schematic diagram of a short channel vertical fin field effect transistor at an intermediate stage of fabrication showing a semiconductor fin extending upward from a bottom source/drain region and a gate conductor disposed over opposing sidewalls of the fin.

An example short channel vertical fin field effect transistor structure is shown in FIG. 1. The structure includes a semiconductor substrate 100 with a semiconductor fin 200 extending upward from a bottom source/drain region 300. Bottom source/drain region 300 may comprise a doped semiconductor material while the fin 200 may comprise an undoped or lightly doped semiconductor material with a dopant polarity opposite to that of the bottom source/drain region 300, as will be appreciated by one skilled in the art.

A gate stack 400 comprising a gate dielectric 410 and a gate conductor 420 is disposed over sidewalls of the fin 200. The gate dielectric layer 410 is formed directly over the fin sidewalls and is separated from the bottom source/drain region 300 by a bottom spacer 320. Bottom spacer 320 is adapted to electrically isolate the bottom source/drain region 300 from the gate stack 400. For instance, the thickness and composition of the bottom spacer 320 can be selected in order to provide an acceptably low parasitic capacitance between the bottom source/drain region 300 and the gate stack 400. The gate conductor 420 is disposed over opposing sidewalls of the fin, i.e., directly over the gate dielectric layer 410, defining a channel region having a channel length $l_v$ and a channel width w on each sidewall of the fin. A top spacer 520 isolates the gate stack 400 from a top source/drain region 500. Electrical contacts to the gate, top source/drain, and bottom source/drain have been omitted for clarity. The direction of current flow through the device during operation is shown schematically by dashed arrows.

As will be appreciated, the channel length is defined by the dimensions of the overlying gate conductor 420, 422, 424. As such, reference herein to control of the channel length relates also to control of the gate length, and vice versa, unless the context indicates otherwise.

Figure 2:
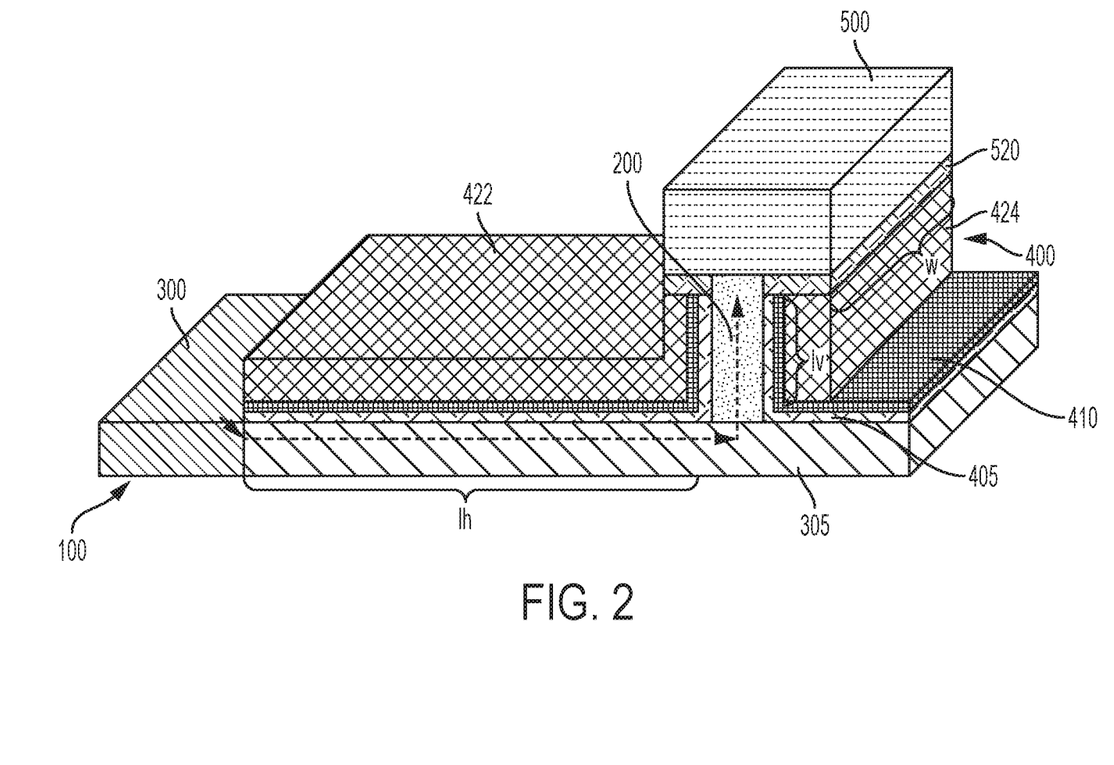
FIG. 2 is a simplified schematic diagram of an example long channel vertical fin field effect transistor at an intermediate stage of fabrication showing a semiconductor fin extending upward from a well region and a gate conductor disposed over sidewalls of the fin and extending laterally over the well region.

FIG. 2 is a simplified schematic diagram of an example long channel vertical fin field effect transistor according to various embodiments. The long channel structure includes a semiconductor fin 200 that extends upward from a well region 305. Well region 305 may comprise a lightly doped semiconductor material with a dopant polarity opposite to that of the bottom source/drain region 300, as will be appreciated by one skilled in the art. For instance, the well region may be doped to a peak concentration of $1 \times 10^{16}$ to $1 \times 10^{19}$ atoms/cm$^3$.

A gate stack 400 comprising a first gate dielectric layer 405, a second gate dielectric layer 410, and a gate conductor 420 is disposed over sidewalls of the fin 200. The first gate dielectric layer 405 is formed directly over the well region 305 and over the sidewalls of the fin 200, and the second gate dielectric layer 410 is formed directly over the first gate dielectric layer 405.

The gate conductor includes a main gate 422 and secondary gate 424 disposed over opposing sidewalls of the fin, i.e., directly over the second gate dielectric layer 410. The main gate 422 also extends laterally over the well 305 adjacent to the fin, defining a channel region having a channel length $(l_h+l_v)$ and a channel width w. Thus, the main gate 422 includes a horizontal component $(l_h)$ in addition to a vertical component $(l_v)$. In certain embodiments, the channel length of the device is greater than the vertical distance between the bottom source/drain region and the top source/drain region.

As used here, "horizontal" refers to a general direction along a primary surface of a substrate, and "vertical" is a direction generally orthogonal thereto. Furthermore, "vertical" and "horizontal" are generally perpendicular directions relative to one another independent of orientation of the substrate in three-dimensional space.

In various embodiments, the main gate 422 extends laterally in a direction orthogonal to a length direction of the fin 200. For instance, the length $(l_h)$ of the extended portion of the main gate 422 measured from the fin sidewall may range from 5 to 200 nm, e.g., 5, 10, 20, 50, 100, 150 or 200 nm, including ranges between any of the foregoing values. The secondary gate 424 is characterized by a vertical gate length, $l_v$. The direction of current flow through the device during operation is shown schematically by dashed arrows according to various embodiments.

With the foregoing long channel architecture, the channel length may be defined independent of the fin height. That is, the channel length may be less than, equal to, or even greater than the height of the fin. Furthermore, according to various embodiments, vertical FinFET devices having different channel lengths can be formed from fins having substantially identical dimensions by lithographically defining the horizontal component of the channel, $l_h$. In various embodiments, the channel length of plural devices formed on the same substrate may independently range from 15 to 200 nm, e.g., 15, 20, 30, 40, 50, 80, 100, 120, 150, 180 or 200 nm, including ranges between any of the foregoing values.

In certain embodiments, a top spacer layer 520 is formed over a recessed gate stack. Formation of the top spacer layer 520 may include a conformal deposition process such as chemical vapor deposition (CVD), followed by an anisotropic etch to remove the spacer material(s) from horizontal surfaces and expose the fins along top surfaces thereof.

The thickness of the top spacer 520 may range from 1 to 30 nm, e.g., 1, 2, 5, 10, 20 or 30 nm, including ranges between any of the foregoing values. The top spacer 520 may comprise, for example, silicon dioxide ($SiO_2$). Alternatively, top spacer 520 may comprise other dielectric materials such as silicon nitride, silicon oxynitride, a low-k material, or any suitable combination of these materials. Top spacer layer 520 is adapted to isolate the top source/drain region 500 from the gate of the transistor.

Top source/drain region 500 may be formed by selective epitaxial growth from exposed portions of the semiconductor fin 200. The terms "epitaxy," "epitaxial" and/or "epitaxial growth and/or deposition" refer to the growth of a semiconductor material layer on a deposition surface of a semiconductor material, in which the semiconductor material layer being grown assumes the same crystalline habit as the semiconductor material of the deposition surface. For example, in an epitaxial deposition process, chemical reactants provided by source gases are controlled and the system parameters are set so that depositing atoms alight on the deposition surface and remain sufficiently mobile via surface diffusion to orient themselves according to the crystalline orientation of the atoms of the deposition surface. Therefore, an epitaxial semiconductor material has the same crystalline characteristics as the deposition surface on which it is formed. For example, an epitaxial semiconductor material deposited on a (100) crystal surface will take on a (100) orientation. Top source/drain junctions 270 may comprise silicon, silicon germanium, or another suitable semiconductor material.

The selective epitaxy process deposits an epitaxial layer directly onto the exposed surfaces of the fin. Exposed surfaces of the fins may include the top surface as well as upper portions of the sidewalls of the fin proximate to the top surface. In various embodiments, a silicon epitaxial layer is formed without deposition of silicon on the exposed dielectric surfaces. Selective epitaxial layers may be formed using molecular beam epitaxy or chemical vapor deposition processes that are adapted for selective epitaxy.

An example silicon epitaxial process for forming top source/drain region 500 uses a gas mixture including $H_2$ and dichlorosilane ($SiH_2Cl_2$) at a deposition (e.g., substrate) temperature of 300-800° C. Other suitable gas sources for silicon epitaxy include silicon tetrachloride ($SiCl_4$), silane ($SiH_4$), trichlorosilane ($SiHCl_3$), and other hydrogen-reduced chlorosilanes ($SiH_xCl_{4-x}$).

Top source/drain region 500 may be doped, as will be appreciated by one skilled in the art. In various embodiments, the dopant type and concentration with the top source/drain region 500 may be equal to the dopant type and the dopant concentration within the bottom source/drain region 300. For instance, the top source/drain region and the bottom source/drain region may be independently doped to a peak concentration of $5 \times 10^{19}$ to $1 \times 10^{21}$ atoms/$cm^3$.

Various embodiments relate to the manufacture of a vertical FinFET where the channel length is controlled. Control of the channel length includes the formation of both short channel and long channel devices, such as the formation of such devices on a single semiconductor substrate. In addition, the disclosed methods and structures relate to the formation of more than one type of device. For instance, in addition to variable channel length structures, both thin gate devices and thick gate devices can be manufactured on the same semiconductor substrate, where each type of device may include a short channel architecture or a long channel architecture.

Thin gate FinFETs are generally used in high-performance, low supply voltage ($V_{dd}$) logic circuits, and thick gate FinFETs are generally used in high $V_{dd}$ input/output (I/O) circuits. In manufacturing a CMOS device having both types of structures, and as will be explained in further detail below, a hard mask is typically disposed on the top of a plurality of fins, and a dielectric layer is conformally deposited on the hard mask and over the sides of the fins. A layer of photoresist is then selectively applied to the fins of the thick gate device, and lithographic and etching techniques are used to remove the dielectric layer from over the fins not protected by the photoresist layer, i.e., in regions where thin gate structure will be formed. Thick gate devices will be formed in regions where the dielectric layer is not removed. A gate stack comprising a gate dielectric and a gate conductor is then deposited over the fins, as well as over the dielectric layer in the thick gate regions. Additional patterning and etching steps are used to cut the gate conductor layer and define the channel length for each of the devices.

Figure 3:
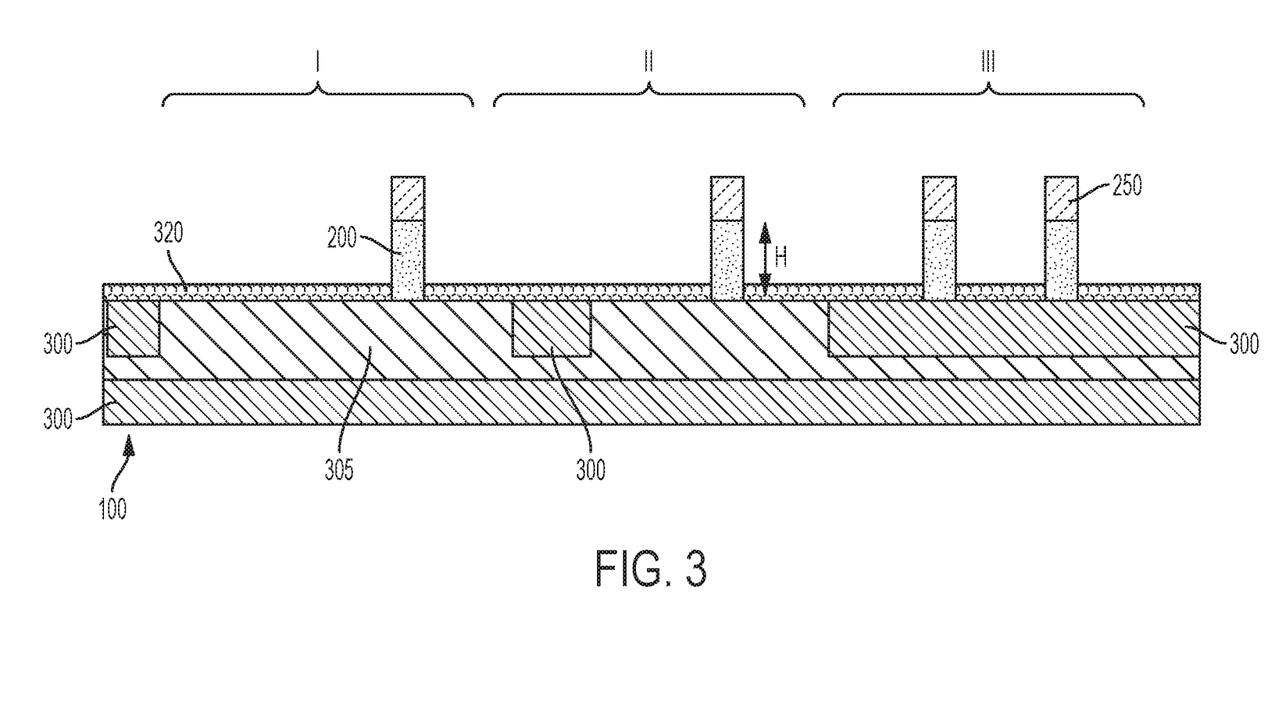
FIG. 3 is a cross-sectional view of a semiconductor structure showing plural semiconductor fins arranged in respective device regions over a semiconductor substrate following the deposition of a bottom spacer.

Reference will now be made to FIGS. 3-10, which together with the following description, provide an exemplary method for manufacturing a vertical FinFET where the channel length is controlled. FIG. 3 depicts a vertical FinFET structure at an intermediate stage of fabrication. The structure includes a semiconductor substrate 100 having a plurality of fins 200 formed thereon. Semiconductor substrate 100 may be a bulk substrate or a hybrid substrate such as a semiconductor-on-insulator (SOI) substrate, and may include a semiconductor material such as silicon, such as single crystal Si, polycrystalline Si, or a silicon-containing material.

Silicon-containing materials include, single crystal silicon germanium (SiGe), polycrystalline silicon germanium, silicon doped with carbon (Si:C), amorphous Si, as well as combinations and multi-layers thereof. As used herein, the term "single crystal" denotes a crystalline solid, in which the crystal lattice of the entire solid is substantially continuous and substantially unbroken to the edges of the solid with substantially no grain boundaries.

The substrate 100 is not limited to silicon-containing materials, however, the substrate 100 may comprise other semiconductor materials, including Ge and compound semiconductors, including III-V compound semiconductors such as GaAs, InAs, GaN, GaP, InSb, ZnSe, and ZnS, and II-VI compound semiconductors such as CdSe, CdS, CdTe, ZnSe, ZnS and ZnTe.

In the illustrated embodiment, substrate 100 is a bulk silicon substrate. In alternate embodiments, the semiconductor substrate 100 may be an SOI substrate that comprises, from bottom to top, a handle portion, an isolation layer, and a semiconductor material layer.

Substrate 100 may have dimensions as typically used in the art and may comprise, for example, a semiconductor wafer. Example wafer diameters include, but are not limited to, 50, 100, 150, 200, 300 and 450 mm. The total substrate thickness may range from 250 microns to 1500 microns, although in particular embodiments the substrate thickness is in the range of 725 to 775 microns, which corresponds to thickness dimensions commonly used in silicon CMOS processing. The semiconductor substrate 100 may comprise (100)-oriented silicon or (111)-oriented silicon, for example.

In several embodiments, the fins 200 are formed by patterning and then etching the semiconductor substrate 100, i.e., a top portion of the semiconductor substrate, such that the fins are contiguous with the substrate 100. The patterning process may comprise photolithography, which includes forming a layer of photoresist material (not shown) atop a material or material stack to be patterned.

The deposited photoresist is then subjected to a pattern of irradiation, and the exposed photoresist material is developed utilizing a conventional resist developer. In the instant embodiment, this provides a patterned layer of photoresist atop a hard mask layer 250, which is disposed over a top surface of the substrate 100. The pattern provided by the patterned photoresist material is thereafter transferred into the underlying material layer or material layers (e.g., hard mask 250 and substrate 100) utilizing at least one pattern transfer etching process.

In various embodiments, hard mask 250 comprises a dielectric material such as silicon oxide, silicon nitride, silicon oxynitride or combinations thereof. In particular embodiments, the hard mask layer 250 includes a layer of silicon oxide and an overlying layer of silicon nitride. For example, the hard mask may include a layer of silicon oxide disposed directly over the top surfaces of the fins, and a layer of silicon nitride disposed directly over the layer of silicon oxide. The thickness of the hard mask layer may range from 15 to 50 nm, e.g., 15, 20, 30, 40 or 50 nm, including ranges between any of the foregoing values. In the illustrated embodiment, the patterned hard mask layer 250 overlies respective ones of the fins 200.

The pattern transfer etching process is typically an anisotropic etch. In certain embodiments, a dry etching process such as, for example, reactive ion etching can be used. In other embodiments, a wet chemical etchant can be used. In still further embodiments, a combination of dry etching and wet etching can be used.

In further embodiments, the fins 200 may be formed using a sidewall image transfer (SIT) process, which includes formation of a spacer material on sidewall surfaces of a mandrel. The spacer includes a material that has a different etch selectivity than the mandrel such that, after spacer formation, the mandrel is removed by etching. Each spacer is then used as a hard mask during a subsequent etching process that defines the fins.

As used herein, a "fin" refers to a contiguous semiconductor material that includes a pair of vertical sidewalls that are parallel to each other. As used herein, a surface is "vertical" if there exists a vertical plane from which the surface does not deviate by more than three times the root mean square roughness of the surface.

In various embodiments the as-formed fins 200 are free standing, i.e., supported only by the substrate 100, and can comprise a single crystal semiconductor material that extends along a lengthwise direction. As used herein, a "lengthwise direction" is a horizontal direction along which an object extends the most. A "widthwise direction" (W) is a horizontal direction that is perpendicular to the lengthwise direction. Each fin has a height (H) that may range from 10 nm to 100 nm and a width (W) that may range from 4 nm to 30 nm. Other heights and widths that are less than or greater than the values mentioned can also be used. The fins 200 may have an aspect ratio (H/W) ranging from 1 to 5, e.g., 1, 1.5, 2, 3, 4 or 5, including ranges between any of the foregoing values.

In various embodiments, each of a plurality of semiconductor fins 200 extends along a lengthwise direction with a substantially rectangular vertical cross-sectional shape. As used herein, a "substantially rectangular shape" is a shape that differs from a rectangular shape only due to atomic level roughness that does not exceed 2 nm. The substantially rectangular vertical cross-sectional shape is a shape within a plane including a vertical direction and a widthwise direction.

Plural fins may have equal or substantially equal dimensions, i.e., height and/or width. As used herein, "substantially equal" values differ from each other by 10% or less, e.g., 0, 1, 2, 4 or 10%, including ranges between any of the foregoing values.

As will be appreciated by those skilled in the art, a bulk fin cut or fin removal process can be used to remove one or more unwanted fins or fin segments from the intermediate structure. In structures comprising plural fins, i.e., a fin array, each fin may be spaced apart from its nearest neighbor by a periodicity or pitch (d) of 15 nm to 100 nm, e.g., 15, 20, 25, 30, 40, 50, 75 or 100 nm, including ranges between any of the foregoing values. Within each array, the fins can be evenly spaced such that the distance between the adjacent fins is the same. Such plural fins are typically oriented parallel to each other and perpendicular to the library logic flow of a circuit.

With continued reference to FIG. 3, the semiconductor structure may include a first long channel region (I), a second long channel region (II) and a first short channel region (III). As disclosed in further detail below, a thick gate vertical FinFET can be formed in the first long channel region (I), and a thin gate vertical FinFET can be formed in each of the second long channel region (II) and the first short channel region (III).

Isolation regions such as shallow trench isolation (STI) regions (not shown) may be formed in substrate 100, i.e., between fins, by etching regions of the substrate to form trenches that are back-filled with a dielectric layer. For instance, isolation regions may comprise an oxide such as silicon dioxide, which provides physical and electrical isolation between devices. Although a single semiconductor fin 200 is shown in each device region, any number of fins 200 may be employed.

The semiconductor material forming fins 200 may be doped, un-doped, or contain doped and un-doped regions therein. Each doped region within the semiconductor fins 200 may have the same or different doping concentrations and/or conductivities. Doped regions that are present can be formed, for example, by ion implantation, gas phase doping, or by dopants that are present in the material used to form the fins. For instance, semiconductor substrate 100 may comprise a doped well region 305. As known to those skilled in the art, a doped well region 305 may be fabricated using a masking layer and implantation step. By repeating this process, multiple doped well regions may be formed to provide some regions with p-type dopants, other regions with n-type dopants, and still other regions without deliberately added dopants. For simplicity, FIG. 3 only indicates a single doped well region 305. Fins 200 may be initially and uniformly doped and have a dopant concentration in the range of $1\times10^{15}$ atoms/cm$^3$ to $2\times10^{18}$ atoms/cm$^3$.

Referring still to FIG. 3, an ion implantation process with a masking layer to block implants in certain regions may be applied to the semiconductor substrate 100 to form bottom source/drain (S/D) region 300. The choice of dopant may be based on the doping type of the semiconductor substrate 100 and/or the fins 200. For example, if the semiconductor substrate 100 and fins 200 are doped with a p-type material (e.g., boron), the dopant may be n-type (e.g., phosphorus), which results in an n-type source/drain region (i.e., an NFET). If, alternatively, the semiconductor substrate 100 and fins 200 are doped with an n-type material (e.g., phosphorus), the dopant may be p-type (e.g., boron) to form a p-type source/drain region (i.e., a PFET).

As known to those skilled in the art, doping changes the electron and hole carrier concentrations of an intrinsic semiconductor at thermal equilibrium. As used herein, "p-type" refers to the addition of impurities to an intrinsic semiconductor that creates a deficiency of valence electrons. For silicon, example p-type dopants, i.e., impurities, include but are not limited to, boron, nitrogen, aluminum, gallium, and indium. As used herein, "n-type" refers to the addition of impurities that contribute free electrons to an intrinsic semiconductor. For silicon, example n-type dopants, i.e., impurities, include but are not limited to, antimony, arsenic, and phosphorus. In various processes, one or more dopants may be introduced into a semiconductor material by plasma doping, ion implantation, or gas phase doping.

A bottom spacer 320 is formed over the shallow trench isolation (not shown) and over a top surface of the substrate 100, including directly over bottom source/drain regions 300 and well regions 305. The bottom spacer 320 may be formed using a deposition method such as chemical vapor deposition (CVD), plasma-enhanced chemical vapor deposition (PECVD), high-density CVD (HDCVD), atomic layer deposition (ALD), or a physical vapor deposition (PVD) technique such as sputtering or evaporation. Alternatively, the bottom spacer 320 may be formed by oxidizing a top surface of the substrate.

The thickness of the bottom spacer 320 may range from 10 to 20 nm, e.g., 10, 15 or 20 nm, including ranges between any of the foregoing values. The bottom spacer 320 may comprise, for example, silicon dioxide ($SiO_2$). Alternatively, bottom spacer 320 may comprise other dielectric materials such as silicon nitride, silicon oxynitride, a low-k material, or any suitable combination of these materials. Bottom spacer 320 is adapted to isolate the bottom source/drain region 300 from a later-formed gate.

Figure 4:
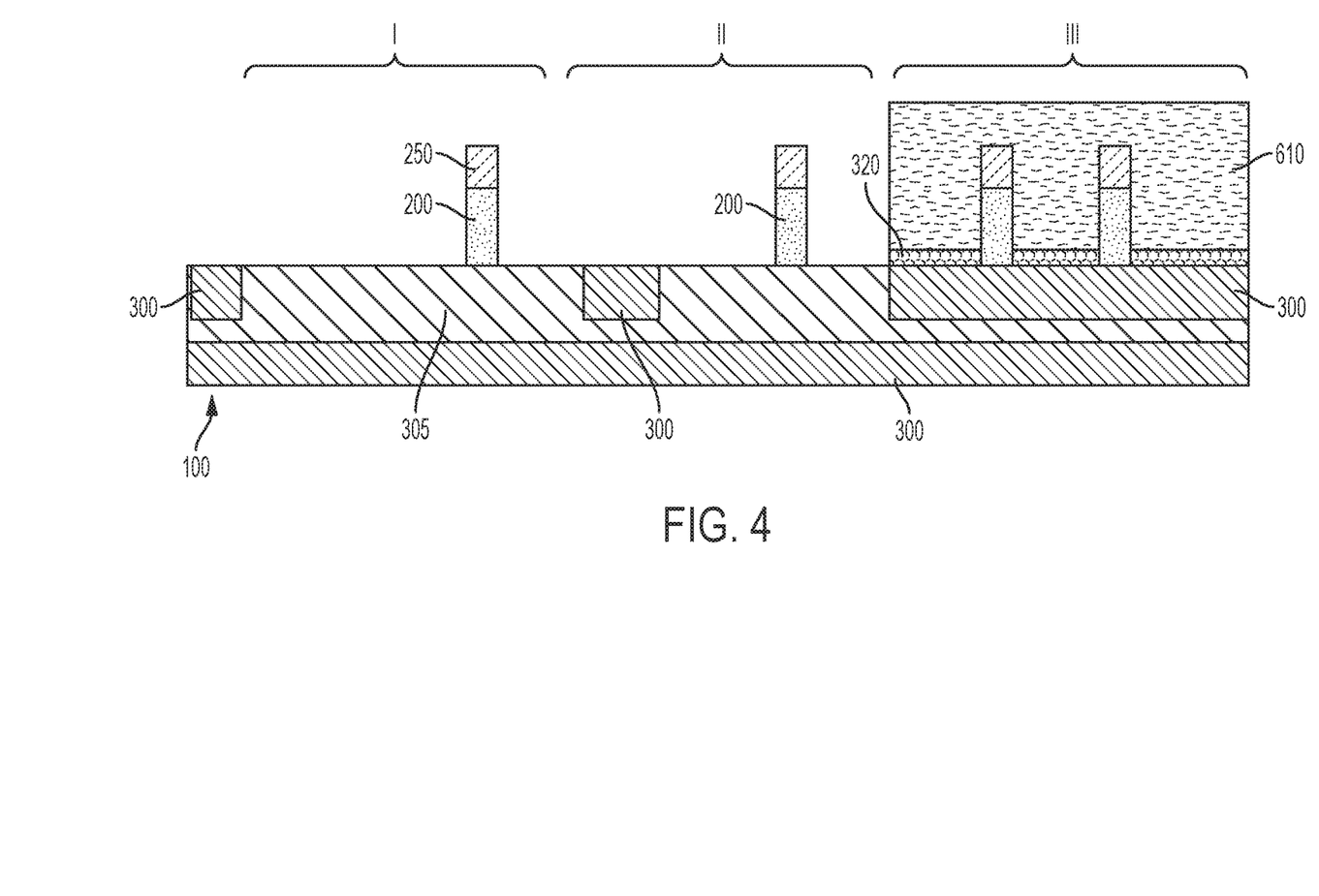
FIG. 4 is a cross-sectional view of a semiconductor structure depicting the removal of the bottom spacer from within long channel device regions according to various embodiments.

Referring to FIG. 4, a first sacrificial photoresist layer 610 is formed to protect the bottom spacer 320 within first short channel region (III). The first sacrificial photoresist layer 610 may include a positive-tone photoresist composition, a negative-tone photoresist composition, or a hybrid-tone photoresist composition. A layer of photoresist material may be formed by a deposition process such as, for example, spin-on coating.

At this stage of fabrication, the long channel device regions (I, II) are unprotected and the bottom spacer 320 is removed from within the long channel device regions (I, II) to expose a top surface of the bottom source/drain 300 and well 305. As will be appreciated, partial removal of the hard mask 250 from atop fins 200 in device regions (I, II) may accompany removal of the bottom spacer 320. Thus, in certain embodiments, the thickness of the hard mask prior to etching the bottom spacer 320 is equal to or greater than the thickness of the bottom spacer 320. The first sacrificial photoresist layer 610 may then be removed using any suitable etching or stripping technique.

Figure 5:
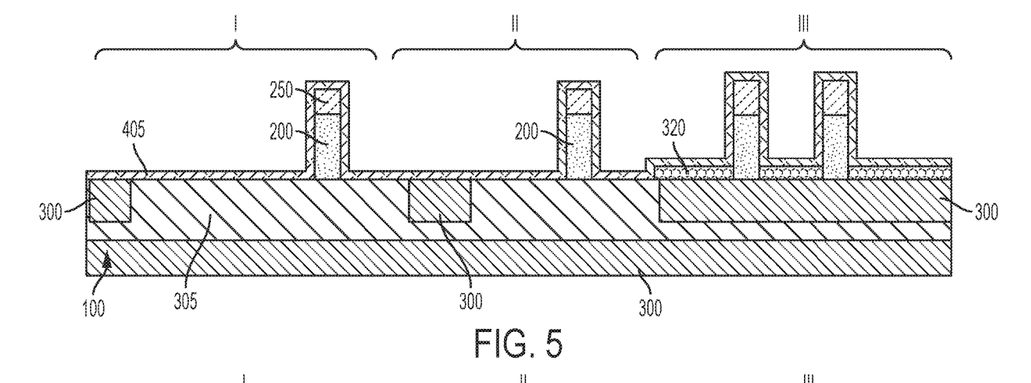
FIG. 5 is a cross-sectional view of a semiconductor structure depicting the formation of a conformal dielectric layer over the structure of FIG. 4.

FIG. 5 is a cross-sectional view depicting the formation of a conformal dielectric layer 405 after removal of the first sacrificial photoresist layer. The conformal dielectric layer 405 may be deposited using, for example, chemical vapor deposition (CVD), plasma-enhanced chemical vapor deposition (PECVD), high-density CVD (HDCVD), atomic layer deposition (ALD), plasma-enhanced atomic layer deposition (PEALD), or a physical vapor deposition (PVD) technique such as sputtering or evaporation. Alternatively, conformal dielectric layer 405 may be formed by thermal oxidation, or by a combination of the above processes.

In various embodiments, dielectric layer 405 is a thick gate oxide layer and comprises silicon dioxide, which may be formed using, for example, a PEALD process, which allows the dielectric layer 405 to be deposited conformally. Thus, in a thick gate device, the gate dielectric comprises dielectric layer 405 and a later-deposited high-k layer, while in a thick gate device, the gate dielectric includes a high-k layer but does not include the conformal dielectric layer 405. The thickness of the conformal dielectric layer 405 may range from 5 to 50 nm, e.g., 5, 10, 15, 20, 30, 40 or 50 nm, including ranges between any of the foregoing values.

Figure 6:
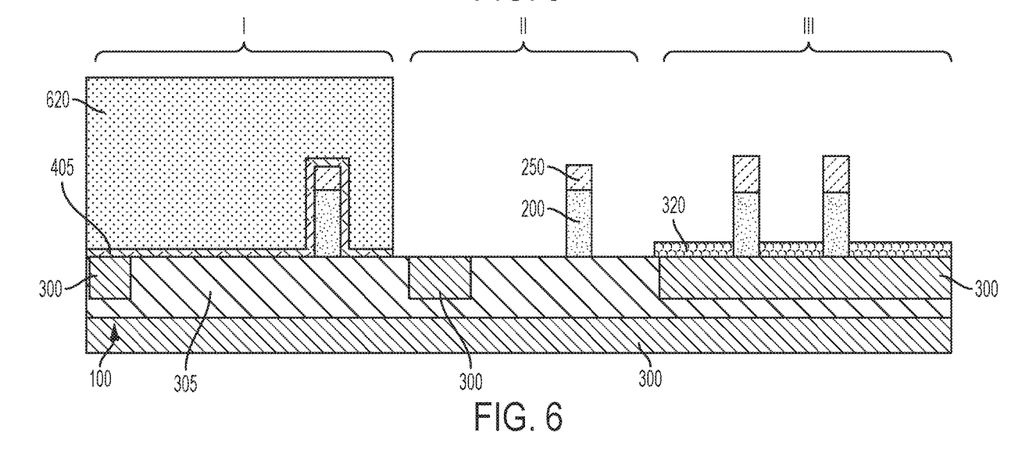
FIG. 6 is a cross-sectional view of a semiconductor structure depicting masking of a first long channel device region and removal of the conformal dielectric layer from each of a second long channel device region and a short channel device region.

FIG. 6 depicts the formation and patterning of a second sacrificial photoresist layer 620 over the first long channel device region (I) including dielectric layer 405, and the subsequent removal of the dielectric layer 405 (thick gate oxide layer) from within the thick gate device regions, i.e., second long channel device region (II) and first short channel device region (III). The material and process used to form the second sacrificial photoresist layer 620 may be similar to the material and process used to form the first sacrificial photoresist layer 610. After etching the conformal dielectric layer 405, the second sacrificial photoresist layer 620 is removed.

Figure 7:
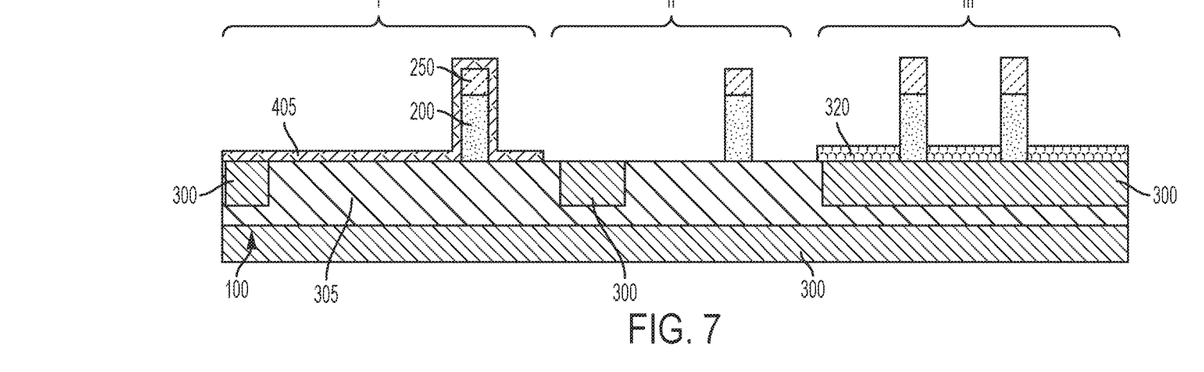
FIG. 7 shows removal of the masking layer from the structure of FIG. 6.

A wet etching process can be used to remove the second sacrificial photoresist layer 620 and generate the structure of FIG. 7. For example, hydrofluoric acid (HF) or a dilute solution comprising HF can be used remove the dielectric layer 405, and sulfuric acid ($H_2SO_4$) can be used to strip the second sacrificial photoresist layer 620. The dielectric layer 405 remains disposed over the fin 200 and over the bottom source/drain 300 and well 305 within the first device region (I).

Figure 8:
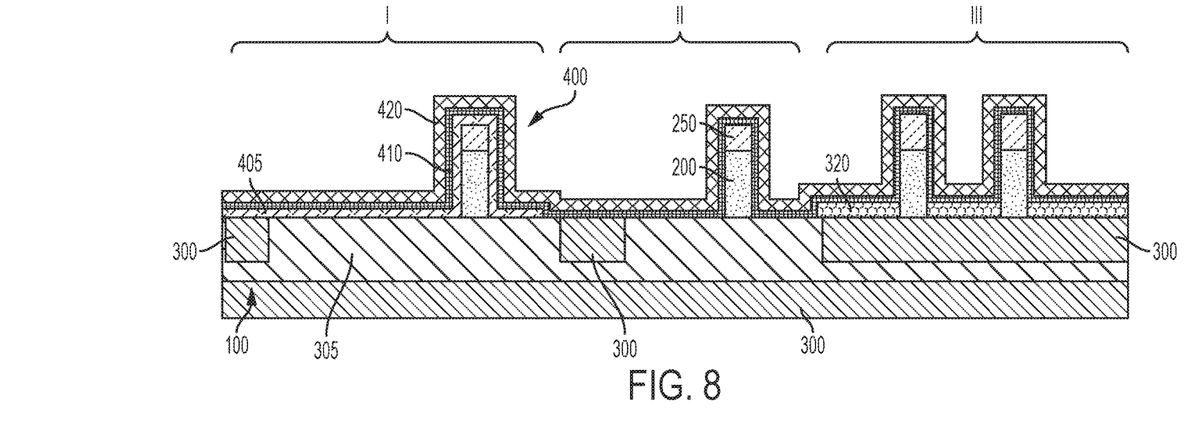
FIG. 8 is a cross-sectional view of a semiconductor structure illustrating the formation of a gate stack comprising a gate dielectric and a gate conductor over the structure of FIG. 7.

Referring to FIG. 8, a gate stack 400 is then formed over the tops and sidewalls of the fins 200. In a region laterally adjacent to the fin within the first long channel region (I), the gate stack 400 is formed over dielectric layer 405. In a region laterally adjacent to the fin within the second long channel region (II), the gate stack 400 is formed over bottom source/drain 300 and well 305. In a region laterally adjacent to the fin within the first short channel region (III), the gate stack 400 is formed over bottom spacer 320.

The gate stack 400 comprises a gate dielectric 410 and a gate conductor 420, which are deposited in succession. The gate dielectric 410 may be a conformal layer that is formed over the fins. Gate dielectric 410 may comprise silicon dioxide, silicon nitride, silicon oxynitride, a high-k dielectric, and/or other suitable material.

As used herein, a high-k material has a dielectric constant greater than that of silicon dioxide. A high-k dielectric may include a binary or ternary compound such as hafnium oxide ($HfO_2$). Further exemplary high-k dielectrics include, but are not limited to, $ZrO_2$, $La_2O_3$, $Al_2O_3$, $TiO_2$, $SrTiO_3$, $BaTiO_3$, $LaAlO_3$, $Y_2O_3$, $HfO_xN_y$, $HfSiO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiO_xN_y$, $SiN_x$, a silicate thereof, and an alloy thereof. Each value of x may independently vary from 0.5 to 3, and each value of y may independently vary from 0 to 2.

The gate dielectric 410 may be deposited by a suitable process such as atomic layer deposition (ALD), chemical vapor deposition (CVD), physical vapor deposition (PVD), thermal oxidation, UV-ozone oxidation, or combinations thereof. A high-k gate dielectric thickness may range from 0.5 nm to 10 nm, e.g., 0.5, 1, 2, 5 or 10 nm, including ranges between any of the foregoing values. In various embodiments, the gate dielectric 410 includes a thin layer (e.g., 0.5 nm) of silicon oxide and an overlying layer of high-k dielectric material. As noted above, in a thick gate device, the gate dielectric 410 is supplemented by underlying thick gate oxide 405.

A gate conductor 420 is formed over the gate dielectric 410. The gate conductor 420 may include a conductive material such as polysilicon, silicon-germanium, a conductive metal such as Al, W, Cu, Ti, Ta, W, Pt, Ag, Au, Ru, Ir, Rh and Re, alloys of conductive metals, e.g., Al—Cu, silicides of one or more conductive metals, e.g., W silicide, and Pt silicide, or other conductive metal compounds such as TiN, TiC, TiSiN, TiTaN, TaN, TaAlN, TaSiN, TaRuN, WSiN, NiSi, CoSi, as well as combinations thereof. The gate conductor 420 may comprise one or more layers of such materials such as, for example, a metal stack including a barrier layer, work function layer, and conductive fill layer.

The gate conductor 420 may be a conformal layer that is formed directly over the gate dielectric 410. The gate conductor 420 can be formed utilizing a conventional deposition process such as, for example, ALD, CVD, metalorganic chemical vapor deposition (MOCVD), molecular beam epitaxy (MBE), PVD, sputtering, plating, evaporation, ion beam deposition, electron beam deposition, laser assisted deposition, or chemical solution deposition. The gate conductor thickness may range from 1 nm to 10 nm, e.g., 1, 2, 5, 8 or 10 nm, including ranges between any of the foregoing values.

Figure 9:
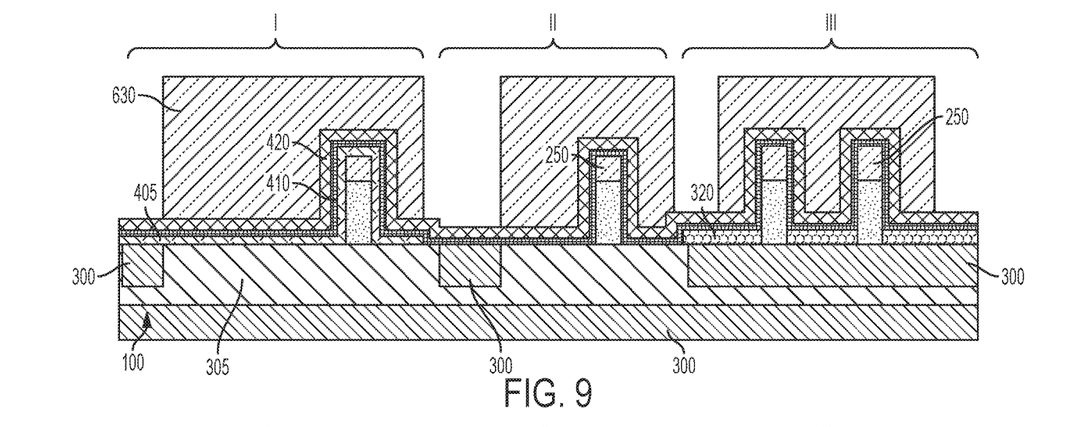
FIG. 9 is a cross-sectional view of a semiconductor structure depicting patterning of the gate stack in each of the device regions.

Referring to FIG. 9, a third sacrificial photoresist layer 630 is then formed over the structure of FIG. 8 and patterned to define the device channel lengths. FIG. 9 depicts patterning of the gate stack in each of the device regions (I, II, III). The material and process used to form the third sacrificial photoresist layer 630 may be similar to the material and process used to form the first or second sacrificial photoresist layers 610, 620.

Figure 10:
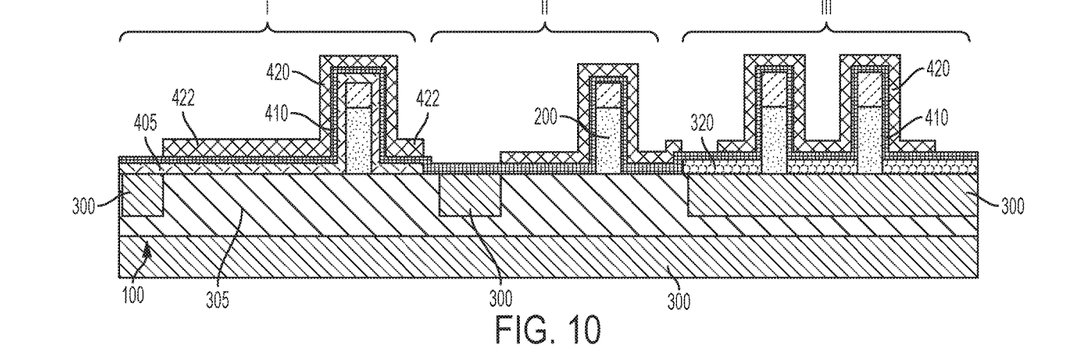
FIG. 10 is a cross-sectional view of a semiconductor structure illustrating etching of the gate conductor to define long channel devices and short channels within respective device regions.

Referring to FIG. 10, the patterned etch of the gate conductor 420 defines the channel length for each device, including long channel devices in regions (I) and (II) and a short channel device within region (III). In certain embodiments, the etch of the gate conductor 420 may comprise a dry etching process such as, for example, reactive ion etching. In other embodiments, the gate conductor etch may comprise a wet etch. In still further embodiments, a combination of dry etching and wet etching can be used.

The gate conductor etch defines a functional gate over each of the fins. A "functional gate" is operable to switch the semiconductor device from an "on" state to "off" state, and vice versa. As illustrated in FIG. 10, after cutting the gate conductor, the third sacrificial photoresist layer 620 can be removed.

As described above, an isotropic etch-back of the gate stack can be used to recess the gate stack with respect to fin. As will be appreciated by one skilled in the art, the etch-back of the gate stack can be followed by the formation of a top spacer, top source/drain, interlayer dielectric and conductive contacts (e.g., through the interlayer dielectric) to source, gate and drain.

Referring to FIG. 10 and again to FIG. 2, in certain embodiments, main gate 422 and secondary gate 424 can be electrically connected and, during operation, biased simultaneously at a common voltage to control the characteristics of the device. In alternate embodiments, main gate 422 and secondary gate 424 can be electrically isolated from one other such that a separate bias can be applied to respective portions of the gate conductor overlying a single fin. For instance, operation of the device may involve applying a first bias to the main gate 422 and applying a second bias unequal to the first bias to the secondary gate 424. In certain embodiments, a first bias can be applied to the main gate 422 while secondary gate 424 can be unbiased and can function as reference gate.

The ability to independently tailor both the inter-fin length and the intra-fin channel length, as well as independently control the voltage applied to opposing sides of a single fin permits robust and comprehensive control of the device characteristics.

Illustrated in FIGS. 3-10 are embodiments of a process to form a vertical field effect transistor having a controlled channel length. The long channel vertical transistor architecture includes a gate conductor that is formed over a sidewall of a fin and extends laterally over the bottom source/drain region. In certain embodiments, both a long channel vertical transistor and a short channel vertical transistor can be manufactured on the same semiconductor substrate. A long channel (LC) vertical transistor may comprise a thick gate device or a thin gate device. Likewise, a short channel (SC) vertical transistor may comprise a thick gate device or a thin gate device.

As used herein, the singular forms "a," "an" and "the" include plural referents unless the context clearly dictates otherwise. Thus, for example, reference to a "fin" includes examples having two or more such "fins" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a dielectric layer that comprises silicon nitride include embodiments where a dielectric layer consists essentially of silicon nitride and embodiments where a dielectric layer consists of silicon nitride.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of making a vertical FinFET device comprising:
    forming a fin having a height (H) on a semiconductor substrate;
    forming a well region in the substrate, where a lower end of the fin is in contact with the well region;
    forming a bottom source/drain region in the substrate laterally adjacent to the well region and spaced away from the fin, forming a main gate stack over at least one sidewall of the fin, the main gate stack extending laterally over the well region and the bottom source/drain region on at least one side of the fin, wherein the main gate stack comprises a main gate dielectric and a main gate conductor formed over the main gate dielectric, and wherein the main gate dielectric is separated from the bottom source/drain region by a bottom spacer formed on the semiconductor substrate prior to forming of the main gate stack; and etching a portion of the main gate conductor over the bottom source/drain region to define a channel region between the main gate conductor and the fin and between the main gate conductor and the well region.

2. The method of claim 1, wherein the channel region comprises a horizontal component over the well region on the at least one side of the fin, and a vertical component over the sidewall of the fin on the at least one side of the fin, and a length of the horizontal component is greater than a length of the vertical component.

3. The method of claim 1, further comprising forming a secondary gate stack over a sidewall of the fin opposite to the main gate stack, wherein the secondary gate stack comprises a secondary gate dielectric and a secondary gate conductor formed over the secondary gate dielectric.

4. The method of claim 3, wherein the secondary gate dielectric is the same as the main gate dielectric.

5. The method of claim 1, further comprising forming a hard mask over a top surface of the fin prior to forming the main gate stack.

6. The method of claim 1, wherein the main gate dielectric comprises silicon dioxide, a high dielectric constant (high-k) layer or a combination thereof.

7. The method of claim 1, further comprising forming a top source/drain region in contact with an upper end of the fin opposite to the lower end.

8. The method of claim 1, wherein forming the well region comprises forming a patterned masking layer, ion implantation, and removal of the patterned masking layer.

9. The method of claim 1, wherein forming the bottom source/drain region comprises forming a patterned masking layer, ion implantation, and removal of the patterned masking layer.

* * * * *